(12) United States Patent
Parette

(10) Patent No.: US 11,431,270 B2
(45) Date of Patent: Aug. 30, 2022

(54) CURRENT ESTIMATION

(71) Applicants: Continental Automotive France, Toulouse (FR); Continental Automotive GmbH, Hannover (DE)

(72) Inventor: Michel Parette, Fontenilles (FR)

(73) Assignees: Continental Automotive France; Continental Automotive GmbH

( * ) Notice: Subject to any disclaimer, the term of this patent is extended or adjusted under 35 U.S.C. 154(b) by 408 days.

(21) Appl. No.: 16/628,407

(22) PCT Filed: Jul. 5, 2018

(86) PCT No.: PCT/FR2018/051689
§ 371 (c)(1),
(2) Date: Jan. 3, 2020

(87) PCT Pub. No.: WO2019/008285
PCT Pub. Date: Jan. 10, 2019

(65) Prior Publication Data
US 2020/0228040 A1     Jul. 16, 2020

(30) Foreign Application Priority Data

Jul. 7, 2017 (FR) ..................................... 1756423

(51) Int. Cl.
*H02P 1/04* (2006.01)
*H02P 23/14* (2006.01)
(Continued)

(52) U.S. Cl.
CPC ........ *H02P 23/14* (2013.01); *G01R 19/16566* (2013.01); *G01R 31/2829* (2013.01);
(Continued)

(58) Field of Classification Search
CPC .......... H02P 23/14; H02P 29/024; H02P 6/28; G01R 19/16566; G01R 31/2829; G01R 31/346; H03K 5/24
See application file for complete search history.

(56) References Cited

U.S. PATENT DOCUMENTS

2014/0285178 A1    9/2014 Williams
2017/0279393 A1*   9/2017 Kawashima ......... B60H 1/3222

FOREIGN PATENT DOCUMENTS

DE       19503180 A1    8/1995
EP       2176886 A1     4/2010
(Continued)

OTHER PUBLICATIONS

International Search Report and Written Opinion for International Application No. PCT/FR2018/051689, dated Oct. 29, 2018, 7 pages.

*Primary Examiner* — Karen Masih
(74) *Attorney, Agent, or Firm* — RatnerPrestia

(57) ABSTRACT

A method for estimating the current flowing through a winding of an electric motor of the type having one winding controllable by a switching device, including the following steps: measuring a voltage at the input of the winding, correcting the measured voltage to produce a corrected voltage determining a resistance of the switching device, estimating the current flowing through the winding by dividing the difference between a control voltage used to control the switching device and the corrected voltage by the resistance. The use of such an estimating method for providing a diagnosis for a current sensor, and an estimating method for controlling an electric motor in fail-soft mode are also disclosed.

18 Claims, 5 Drawing Sheets

(51) Int. Cl.
*G01R 19/165* (2006.01)
*G01R 31/28* (2006.01)
*G01R 31/34* (2020.01)
*H02P 29/024* (2016.01)
*H03K 5/24* (2006.01)

(52) U.S. Cl.
CPC .......... *G01R 31/346* (2013.01); *H02P 29/024* (2013.01); *H03K 5/24* (2013.01)

(56) References Cited

FOREIGN PATENT DOCUMENTS

| | | | |
|---|---|---|---|
| WO | 2009020535 | A1 | 2/2009 |
| WO | 2016038362 | A1 | 3/2016 |

\* cited by examiner

CURRENT ESTIMATION

CROSS REFERENCE TO RELATED APPLICATIONS

This application is the U.S. National Phase Application of PCT International Application No. PCT/EP2018/051689, filed Jul. 5, 2018, which claims priority to French Patent Application No. 1756423, filed Jul. 7, 2017, the contents of such applications being incorporated by reference herein.

FIELD OF THE INVENTION

The present invention relates generally to the field of controlling electric motors. It is aimed in particular at a method for estimating the current flowing through a winding of a motor. This estimation of the current can then be used to diagnose a fault in a current sensor. This estimation of the current can also be used to control the motor in the event of a fault in a current sensor.

BACKGROUND OF THE INVENTION

It is known practice to control an electric motor, comprising at least one winding, by means of a switching device.

SUMMARY OF THE INVENTION

FIGS. 1 and 2 illustrate an embodiment of such control by means of an illustrative switching device 2. A motor M comprises at least one winding 1. In order to turn the motor M, it is fitting to have an alternating current I flow through said winding 1. To that end, a switching device 2 is connected to the input of such a winding 1. The switching device 2 receives a control in the form of a control voltage Ucmd at its input and transforms it into a voltage that is applied to the input of the winding 1.

According to the illustrated embodiment in FIGS. 1 and 2, the control voltage Ucmd is alternating. The PWM unit 4 transforms the control voltage Ucmd into a pulse width modulated (PWM) voltage Upwm, the duty cycle of which is equal to the value of the control voltage Ucmd. This voltage Upwm is used to switch a first switch MOS1 connected between the winding 1 and a substantially constant potential Ubat, while the opposite voltage −Upwm is used to switch a second switch MOS2 connected between the winding 1 and ground. In this way, the two controls are substantially in phase opposition and the open states of the two switches MOS1, MOS2 are such that at most one of the two switches MOS1, MOS2 is switched/on at a given instant, the other being unswitched/off at the same instant.

When, as illustrated in FIG. 1, the first switch MOS1 is switched, the winding 1 is connected to the potential Ubat. At the same time, the second switch MOS2 is off. A current then flows in a first direction. On the other hand, as illustrated in FIG. 2, when the second switch MOS2 is switched, the winding 1 is connected to ground. At the same time, the first switch MOS1 is off. A current then flows in a second direction, opposite to the first direction. The alternation of the controls for the first switch MOS1 and the second switch MOS2 thus allows an alternating current to be created in the winding 1.

In order to safeguard the control and ensure that the two switches MOS1, MOS2 cannot be on simultaneously, which would create a short between the potential Ubat and ground, even in the event of delayed opening, a GDU module 5 modifies one or both signals from Upwm and −Upwm. As illustrated in FIG. 4, this module 5 uses an idle time 14 between the two signals to produce a signal 15, resulting from Upwm, controlling the first switch POS1, and a signal 16, resulting from −Upwm, controlling the second switch POS2. This idle time 14, which is advantageously used in centered fashion, delays the switching/closing of a switch after the opening of the other switch and thus reduces the risk of having both switches MOS1, MOS2 switched on at the same time. The idle time 14 is typically in the order of 500 ns to 2 µs.

As illustrated in block 17 in FIG. 3, a motor M comprises multiple, for example 3, windings 1. Each winding 1 is controlled by a control voltage Ucmd1, Ucmd2, Ucmd3 and comprises a switching device 2 of its own. A computer 3 determines the control voltages Ucmd1-3. These controls are transformed by the switching devices 2 in order to produce currents I1, I2, I3 in each of the windings 1 so as to turn the electric motor M. A measuring means 11 for measuring the current in each winding 1 is used to determine a measurement Imes1, Imes2, Imes3, respectively, of the current flowing through each winding. This current measurement is used by the computer 3 to adapt its control and the control voltages Ucmd1-3.

According to one embodiment, the means 11 comprises a current sensor 11 for each winding 1. According to one embodiment, there is an algebraic relationship between the currents, for example the sum of said currents is zero (Kirchhoff's Law). The means 11 can therefore forego a current sensor 11, which can then be replaced by a calculation on the basis of the other measured currents.

Measurement of the currents Imes flowing through each of the windings 1 is necessary for controlling the electric motor M. It is therefore important to be able to diagnose a fault in a current sensor 11.

It is known practice to diagnose a fault in a current sensor by using one current sensor per winding 1. The relationship between the currents (Kirchhoff's Law) then provides redundant information allowing the consistency of the measurements to be checked. This diagnosis principle has the disadvantage of requiring an additional current sensor, and, what is more, the detection of an inconsistency indicates a fault in at least one sensor but does not allow determination of which sensor(s) is/are faulty.

An aspect of the invention is a method for estimating the current flowing through each winding. This estimation is performed by estimating the current flowing through the switching device by calculating the ratio of the voltage drop across the terminals of said switching device to the resistance thereof. This estimate can advantageously be obtained without adding components, by using only those that exist. This estimate of the current, which is obtained individually for each winding, can be compared with a current measured in said winding in order to provide a diagnosis, which is itself also individualized, for the current sensor associated with said winding. The individualization of the diagnosis allows the control method to be improved by offering at least two fail-soft modes in the event of a fault in a sensor.

This aspect is achieved by virtue of a method for estimating an estimated current flowing through a winding of an electric motor of the type comprising at least one winding controllable by a switching device, comprising the following steps: measuring a measured voltage at the input of the winding, correcting the measured voltage to produce a corrected voltage, determining a resistance of the switching device, estimating the estimated current flowing through the winding by dividing the difference between a control voltage used to control the switching device and the corrected voltage by the resistance.

Thus, this solution provides an individualized estimate of the current flowing through each winding, without adding a component.

According to another feature, the switching device comprises: a first switch connected between the input of the winding and a substantially constant potential, a second switch connected between the input of the winding and ground, and a transformation module capable of receiving the control voltage and of separately opening the two switches on the basis of the control voltage.

According to another feature, the correcting step comprises the steps of: filtering the measured voltage by means of a filter to produce a sinusoidal voltage, compensating for the sinusoidal voltage by means of a compensator capable of compensating for the attenuating effects of the filter to produce a first corrected voltage.

According to another feature, the filter is a low-pass filter, preferably of at least 2nd order.

According to another feature, the compensation uses an interpolation table on the basis of the rotation speed of the motor.

According to another feature, the switching device introduces an idle time producing a voltage variation and the correcting step also comprises a step of adding to the first corrected voltage the voltage variation signed with a sign of the estimated current, in order to produce a second corrected voltage.

According to another feature, the sign of the estimated current is determined from a measurement of a measured current flowing through the winding.

According to another feature, the step of determining the resistance comprises a step of thermal compensation according to the formula: $RdsOn=RdsOnTyp*(1+0.004*(Tmos20° C.))$, where RdsOn is the compensated resistance of the switching device, RdsOnTyp is the typical resistance of the switching device at 20° C. and Tmos is the temperature of the switching device.

According to another feature, the step of estimating the estimated current also comprises a step of canceling the estimated current when the difference between the control voltage and the first corrected voltage is lower, in terms of absolute value, than the voltage variation.

An aspect of the invention also relates to a method for providing a diagnosis for a sensor capable of measuring a measured current flowing through a winding of an electric motor of the type comprising at least one winding controllable by a switching device, comprising the following steps: measuring the measured current flowing through the winding by means of the sensor, determining an estimated current flowing through the winding by means of such an estimating method, comparing the estimated current and the measured current, a negative comparison being indicative of a fault in the sensor.

According to another feature, the comparison step comprises the following steps: calculating a root mean square for the difference between the measured current and the estimated current over a sliding horizon, the comparison being positive if the root mean square is below a threshold, and otherwise negative.

An aspect of the invention also relates to a method for controlling an electric motor of the type comprising multiple windings, which are each controllable by a switching device, each winding comprising a sensor capable of measuring a measured current flowing through the winding, the control method receiving the measured currents at its input and using them to determine the control voltages for the motor, comprising the following steps: providing a diagnosis for each of the sensors by means of such a diagnosis method.

According to another feature, when a sensor is diagnosed as faulty for a winding, the determining of the controls for the motor continues by replacing, for said winding, the measured current with the estimated current.

According to another feature, when a sensor is diagnosed as faulty for a winding, the determining of the controls for the motor continues on the windings while excluding the winding whose sensor is faulty.

BRIEF DESCRIPTION OF THE DRAWINGS

Other novel features and advantages of aspects of the invention will emerge on reading the description below, which is provided by way of indication and entirely without limitation, with reference to the appended drawings, in which.

DETAILED DESCRIPTION OF THE PREFERRED EMBODIMENTS

Figure 8:
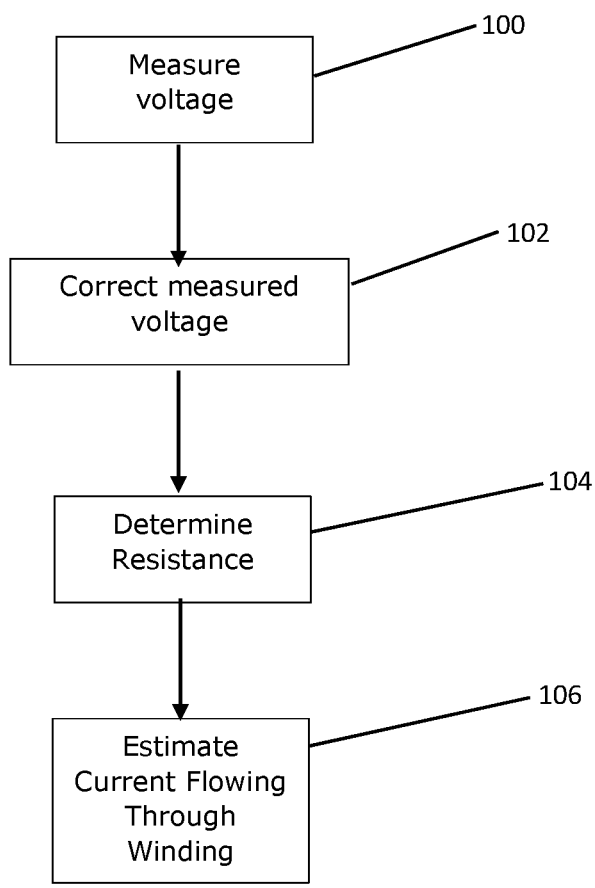
FIGS. 8 and 9 are flowcharts of method according to an aspect of the invention.

A first aspect of the invention is a method for estimating the current Iest flowing through a winding 1 of an electric motor M of the type comprising at least one winding 1 controllable by a switching device 2. The principle of this estimation consists in estimating the current flowing through the switching device 2 by dividing the voltage drop between the output and the input of the switching device 2 by the resistance thereof. For this, (referring to FIG. 8) the method involves the following steps: Step 100, measuring a measured voltage Umes at the input of the winding 1, Step 102, correcting this measured voltage Umes to produce a corrected voltage UcorA, UcorB, Step 104, determining a resistance RdsOn of the switching device 2. A final step 106 of estimating the current Iest flowing through the winding 1 calculates the difference between a control voltage Ucmd used to control the switching device 2 and the corrected voltage UcorA, UcorB, and divides this difference by the resistance RdsOn. It may be noted that the control voltage Ucmd is the voltage applied to the input of the switching device 2, and that the corrected voltage UcorA, UcorB reproduces the voltage at the output of the switching device 2.

The control voltage Ucmd is determined by a computer 3 ensuring control of the motor M. It is typically transmitted to the estimating method directly by the computer 3 producing it.

The switching device 2 comprises: a first switch MOS1 connected between the input of the winding 1 and a substantially constant potential Ubat, a second switch MOS2 connected between the input of the winding 1 and ground, and a transformation module 4, 5 capable of receiving the control voltage Ucmd and of separately opening the two switches MOS1, MOS2 on the basis of the control voltage Ucmd. As described above, the control voltage Ucmd is alternating. The PWM module 4 transforms the control voltage Ucmd into two pulse width modulation voltages Upwm and −Upwm, the duty cycle of which is equal to the amplitude of Ucmd, which is capable of switching the switches MOS1, MOS2. The optional GDU module 5 introduces an idle time 14 and modifies the voltages Upwm and −Upwm into centered-aligned voltages 15 and 16.

The object of the correcting step is to obtain a corrected voltage UcorA, UcorB, capable of being compared with a control voltage Ucmd. The correcting step thus aims to apply to the measured voltage Umes a transformation that is the inverse of that applied to the control voltage Ucmd by the switching device 2, more particularly by the PWM unit 4 and, if applicable, the GDU unit 5. The corrected voltage UcorA or UcorB is thus comparable to the control voltage Ucmd.

For this, the correcting step performs a demodulation operation aiming to eliminate the amplitude width modulation frequency. According to one possible embodiment of this operation, the correcting step comprises a first step of filtering the measured voltage Umes by means of a filter 6, producing a sinusoidal voltage Usin.

According to one advantageous feature, the filter 6 is a low-pass filter, preferably of at least 2nd order. This allows a sinusoidal voltage approaching the initial alternating control voltage Ucmd to be extracted from the measured voltage Umes.

In order to eliminate the modulation frequency, the cut-off frequency is chosen appropriately to a value well below the modulation frequency, while remaining well above the maximum rotation frequency of the motor M. Thus, indicatively, for a modulation frequency of 20 kHz and a motor able to turn at 4000 rpm, or a mechanical frequency of 67 Hz and an electrical frequency of 267 Hz for a motor M having four pole pairs, a cut-off frequency of 800 Hz is appropriate.

Low-pass filtering is a simple means to implement to extract a sinusoidal voltage. However, as can be seen in FIG. 5, it also detrimentally produces an amplitude attenuation that is all the greater since the frequency, and therefore the rotation speed ω of the motor M, increases.

A step of compensating for the sinusoidal voltage Usin is therefore advantageously added. This step is typically used by a compensator 7. Said compensator 7 is designed to amplitude compensate for the attenuating effects of the filter 6. It produces a first corrected voltage UcorA from the voltage Usin.

Figure 5:
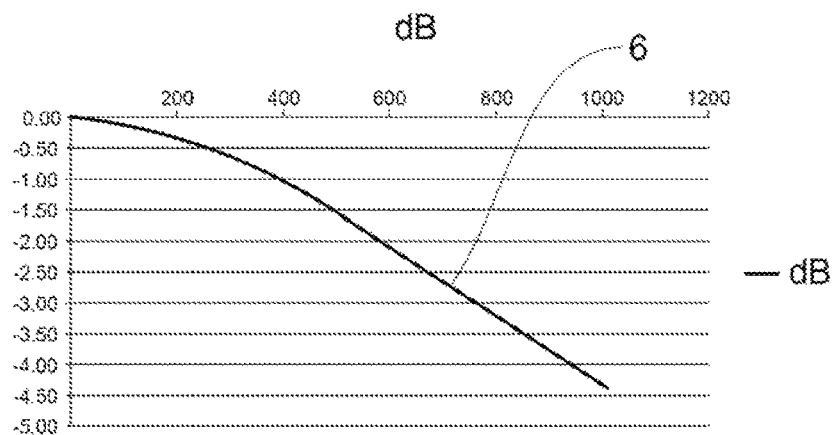
FIG. 5 illustrates an example of a filter used in the correcting step.
Figure 6:
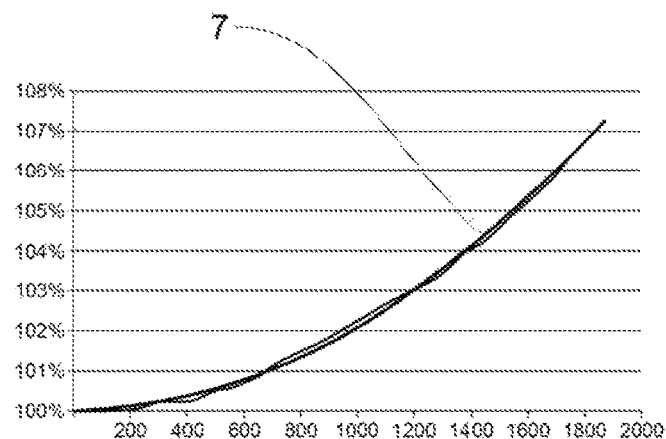
FIG. 6 illustrates a compensation used following the filtering of FIG. 5, in the correcting step.

FIG. 6 illustrates a compensator 7 designed to compensate for the filter 6 in FIG. 5. The ordinate indicates the gain, which is higher than 1, that is applied to the voltage Usin resulting from the filter 6, and the abscissa indicates the rotation speed ω of the motor M.

The compensator 7 can be determined theoretically on the basis of the filter 6 or empirically. Once determined, it is typically implemented by an interpolation function or else by a sensor 8 incorporating an interpolation table. This sensor 8 has the rotation speed ω of the motor M at its input and provides the corrective gain to be applied at its output.

The rotation speed ω of the motor M is, for example, measured by the sensor 8 in order to be provided to the estimating method.

Figure 7:
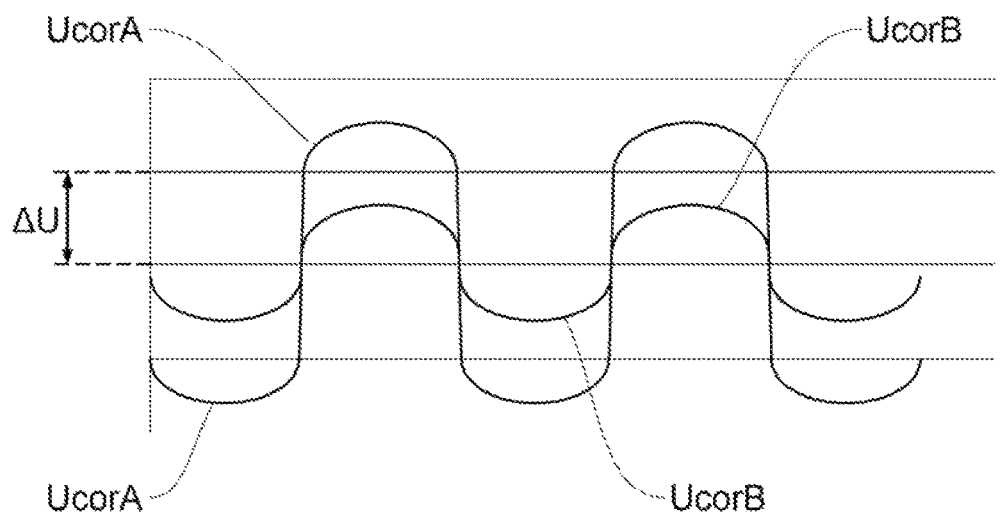
FIG. 7 illustrates the consequence of the idle time for a signal. To improve clarity, identical or similar elements are denoted by identical reference signs throughout the figures.

If the switching device 6 comprises an optional GDU module 5 introducing an idle time 14, the introduction of this idle time 14 produces a voltage variation ΔU. As the idle time 14 is of constant duration, the voltage variation ΔU produced is itself constant and can thus be determined theoretically or empirically. The effect of the idle time 14 is to "stretch" the shape of the voltage signal, as illustrated in FIG. 7, showing the effect of an idle time 14 on a sinusoidal voltage, "stretched" by a quantity ΔU.

In order to correct this effect, the correction step also comprises a step of adding the voltage variation ΔU, affected by the sign S of the current flowing through the winding 1, either the sign S of the estimated current Iest or the equivalent of the sign S of the measured current Imes. The first corrected voltage UcorA resulting from the filtering/compensation is therefore corrected by the voltage variation ΔU signed with the sign S of the current. This produces the second corrected voltage UcorB.

The sign S of the current flowing through the winding 1, which is used in the previous step, is for example measured (or calculated) from the measurement taken by the current sensor 11 arranged on the winding 1. A means 10 for extracting the sign S from the measured current Imes can be employed.

Depending on whether the correcting step comprises one operation: filtering/compensation, or two operations: filtering/compensation and correction of the effect of the idle time, the estimating step compares the control voltage Ucmd either with the first corrected voltage UcorA or with the second corrected voltage UcorB.

After the control voltage Ucmd, resulting from the computer 3, and the corrected voltage UcorA, UcorB, the third parameter needed is the resistance RdsOn of the switching device 2 and in particular the resistance of the switch MOS1 or MOS2. It is possible in a first approximation to directly consider the typical resistance of a switch, or RdsOn=RdsOnTyp, where RdsOn is the resistance used for estimation and RdsOnTyp is the typical resistance of the switching device 2 at 20° C.

However, the effective resistance of the switching device 2 varies greatly on the basis of the temperature and this variation can lead to a large error in the estimation Iest of the current, mainly when said temperature varies according to large amplitudes.

According to a preferred embodiment, the step of determining the resistance RdsOn therefore comprises a step of thermal compensation according to the formula: RdsOn=RdsOnTyp*(1+0.004*(Tmos−20° C.)), where RdsOn is the compensated resistance of the switching device 2, RdsOnTyp is the typical resistance of the switching device 2 at 20° C. and Tmos is the temperature of the switching device 2.

The temperature Tmos can be determined by any method, for example by means of a temperature sensor 9.

According to another advantageous feature, the step of estimating the current Iest also comprises the following operation. The control voltage Ucmd is compared with the first corrected voltage UcorA. If the difference between these two voltages is lower, in terms of absolute value, than the voltage variation ΔU produced by the idle time 14, the estimated current Iest is taken to be equal to 0.

Figure 1:
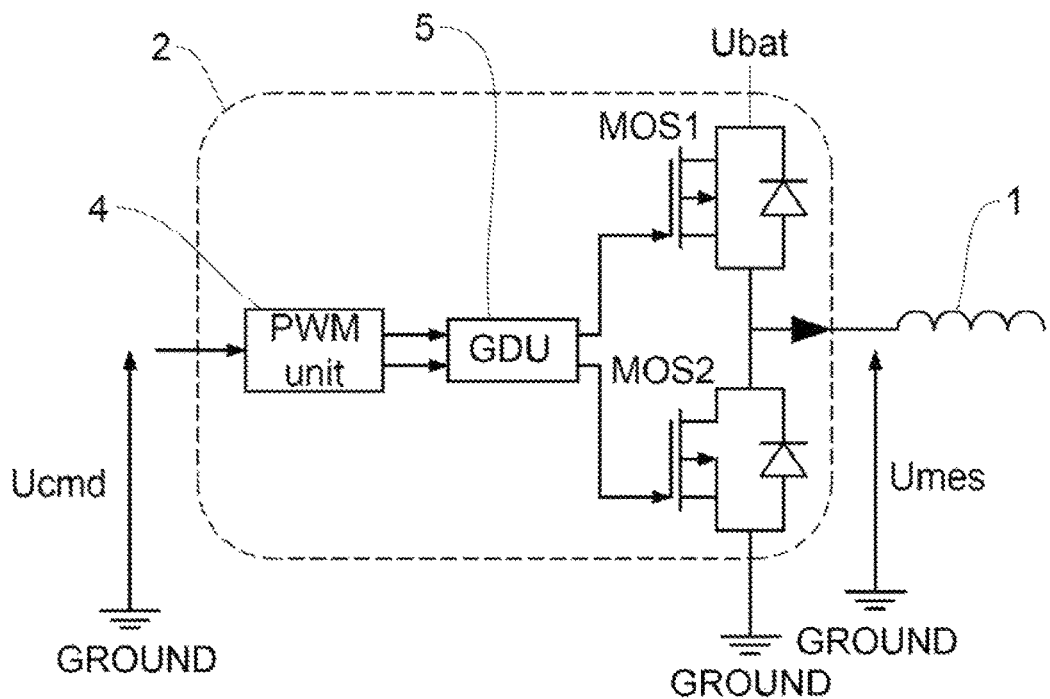
FIGS. 1 and 2, which have already been described, illustrate the two switching states and the direction of the resulting current in a winding.
Figure 2:
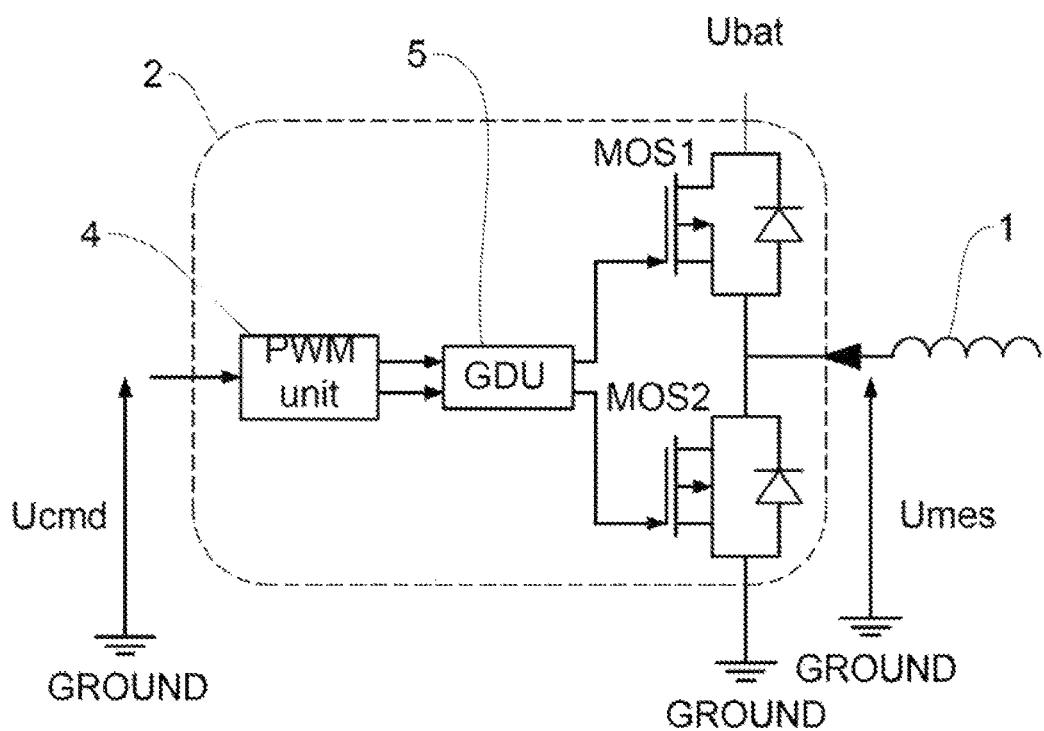
Figure 3:
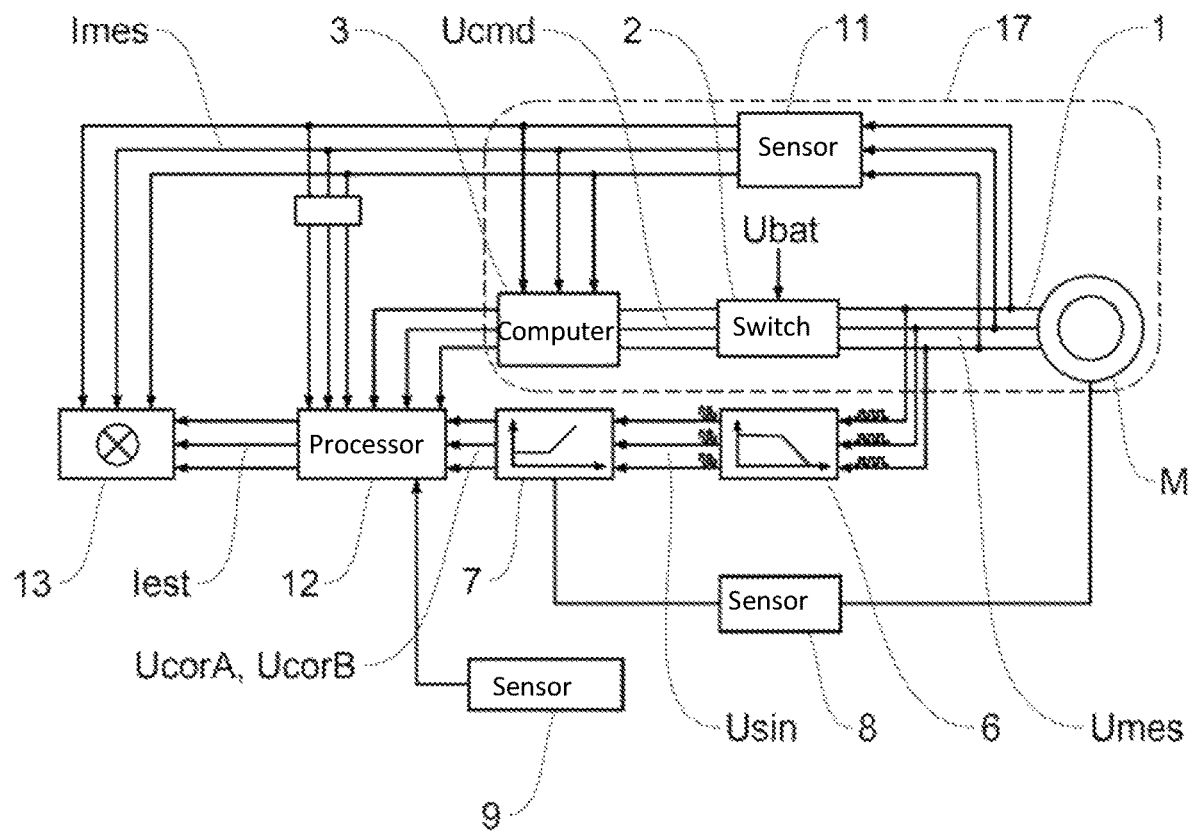
FIG. 3 shows the whole method according to an aspect of the invention applied to a three-phase motor, FIG. 4, which has already been described, illustrates the two centered-aligned signals, comprising an idle time, that are used to control the switches.
Figure 4:
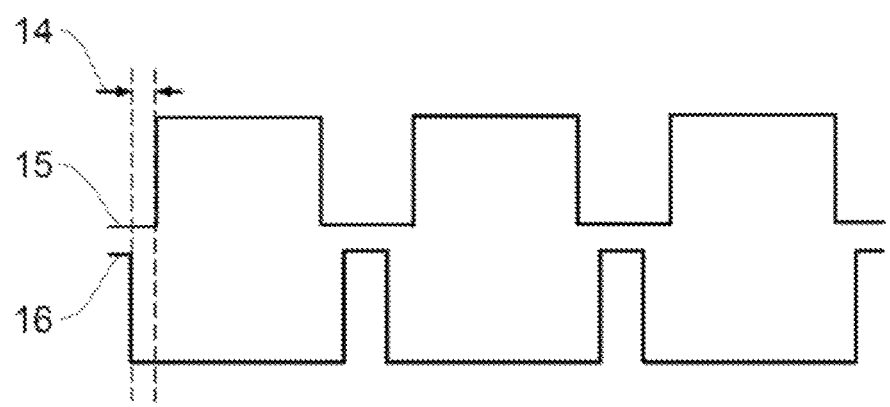

Up until now, the estimating method has been described for a single winding 1. The fact that the estimating method is applicable to one winding 1 advantageously allows it to be individualized. If, as illustrated in FIG. 3, the electric motor M comprises multiple windings 1, for example 3 windings, an estimation of the current Iest1, Iest2, Iest3 can be performed for each winding, advantageously independently.

The estimating method(s) can be implemented by means of a processing unit 12.

Figure 9:
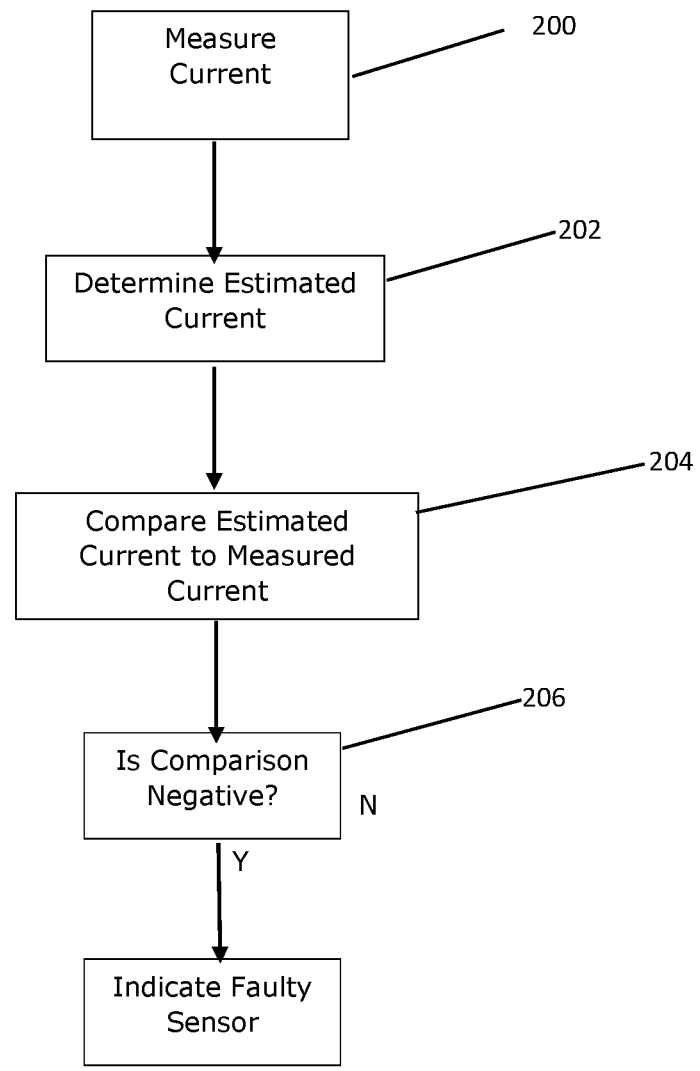

Referring now to FIG. 9, there will now follow a description of how the estimated current Iest can advantageously be used to provide a diagnosis for a current sensor 11.

Still within the context of an electric motor M of the type comprising at least one winding 1 controllable by a switching device 2, at Step 200, the control device 17 for controlling the motor requires a measurement of the measured current Imes flowing through the winding 1.

Said current Imes is measured by means of a measuring means 11. Said measuring means 11 can be an actual current sensor 11. It has been seen that this measuring means 11 can be a virtual current sensor 11 produced by calculation, on account of a relationship between the currents in the various windings (Kirchhoff's Law). The term sensor 11 in the present document therefore interchangeably denotes a current sensor 11 of either of the types actual or virtual.

Any one of the embodiments of the estimating method described above allows there to be an estimated current Iest in a winding 1 (Step 202).

It is advantageously possible, at Step 204, to perform a comparison of the estimated current Iest and the measured current Imes, for one and the same winding 1. A negative comparison at Step 206 is then an indicator of a fault (Step 208) in the current sensor 11 associated with this winding 1. This comparison is implemented in a processing unit 13, for example.

In order to prevent false alarms, it is advantageous for this comparison step if a temporal filtering is performed. For this, according to a preferred embodiment, the comparing step advantageously comprises a calculation of a root mean square Imq for the difference between the measured current Imes and the estimated current Iest, over a sliding horizon.

A root mean square of this kind is typically provided by the formula $$I_{mq} = \sqrt{\frac{\sum\limits_{1}^{N}(I_{mes} - I_{est})^2}{N}},$$

where Imq is the root mean square, Imes is the measured current, Iest is the estimated current and N is a number of samples, defining, in relation to the sampling frequency, the extent of the horizon. The comparison is positive if the root mean square Imq is below a given threshold ImqSeuil, and otherwise negative.

The value of the threshold ImqSeuil takes into account measurement errors in the worst case by taking into account the whole of the measurement chain and all the possible derivatives (thermal, sampling, supply, calibration, etc.).

The number of samples N parameter is typically chosen such that it determines a horizon having a duration above a minimum value large enough to perform certain filtering and prevent false alarms, and below a maximum value giving rise to a risk of continuing with the control of the motor M in the presence of a fault in a sensor 11. Thus, according to one embodiment, the horizon is between 10 and 15 ms. With an indicative sampling period of 500 µs, this leads to a number of samples N between 20 and 30.

Such a diagnosis tool for a current sensor 11 can advantageously be applied individually to all the windings 1 of a motor M, or at least to all the windings 1 comprising an actual sensor 11. In fact, a virtual sensor 11 has less risk of faults and diagnosis therefor is less important. Equipped with this diagnosis tool, it is possible to modify the strategy for controlling the motor M in the event of a fault in a sensor 11.

The method for controlling the motor M according to an aspect of the invention is identical to a control method according to the prior art in all points, unless mentioned specifically. The differences appear only after detection of a fault in a current sensor 11. Thus, in a known manner, the control method receives the measured currents Imes at its input and uses them to determine the control voltages Ucmd, according to servo control.

An aspect of the invention therefore also relates to a method for controlling an electric motor M of the type comprising multiple windings 1, which are each controllable by a switching device 2, each winding 1 comprising a sensor 11 capable of measuring a measured current Imes flowing through the winding 1, the control method receiving the measured currents Imes at its input and using them to determine the control voltages Ucmd for the motor M. This control method is modified, according to an aspect of the invention, in that it comprises an additional step of providing a diagnosis for each of the sensors 11, or at least of the actual sensors, by means of the diagnosis method according to one of the preceding embodiments.

The strategy develops, relative to the prior art, in the event of detection of a fault in a sensor 11. At least two possible fail-soft modes can be envisaged.

According to a first fail-soft mode, when a sensor 11 is diagnosed as faulty for a winding 1, control of the motor M continues by controlling all the windings 1 of the motor M. The control method therefore determines a control voltage Ucmd for each of the windings/phases of the motor M. However, according to a significant feature, the control voltage Ucmd is determined, for the winding 1 whose sensor 11 is faulty, by replacing the measured current Imes normally resulting from said sensor 11 at the input, and therefore in all likelihood having an incorrect value, with the estimated current Iest resulting from the estimating method. Such an embodiment benefits from the possibility, advantageously provided by an aspect of the invention, of allowing determination of which sensor is faulty, so as to determine which current is replaced.

According to a second fail-soft mode, when a sensor 11 is diagnosed as faulty for a winding 1, control of the motor M continues by controlling only the windings 1 of the motor M for which a valid current measurement Imes is actually available, namely the windings except for the winding 1 whose sensor 11 is faulty. The winding 1 whose sensor 11 is faulty is put into the open state and ignored by the control method. It is known practice to control an electric motor comprising n windings/phases by having a current flow only in n-1 windings/phases. It is thus possible to turn a three-phase motor by controlling only two phases. Such an embodiment benefits from the possibility, advantageously provided by an aspect of the invention, of allowing determination of which winding is faulty, so as to determine which winding is ignored.

It should be noted that the estimating and diagnosis methods according to an aspect of the invention continue to be applicable, including in fail-soft mode. Thus, following detection of a fault in a sensor 11 and a change to one or other of the two fail-soft modes, it continues to be possible to estimate the current Iest corresponding to another winding comprising a sensor 11 that is still functional, and it is possible to diagnose a fault in this sensor 11.

Another advantage is that the estimating and diagnosis methods according to an aspect of the invention can be applied to a turning motor M, but also to a stationary motor M.

An aspect of the invention is described above by way of example. It is understood that a person skilled in the art is able to produce different variant embodiments of the invention, for example by combining the various features above taken alone or in combination, without departing from the scope of aspects of the invention in doing so.

The invention claimed is:

1. A method for estimating an estimated current (Iest) flowing through a winding of an electric motor of the type comprising at least one winding controllable by a switching device, the method comprising:
   measuring a measured voltage (Umes) at an input of the winding,
   correcting the measured voltage (Umes) to produce a corrected voltage (UcorA, UcorB),
   determining a resistance (RdsOn) of the switching device,
   estimating, by a processor, the estimated current (Iest) flowing through the winding by dividing a difference between a control voltage (Ucmd) used to control the switching device and the corrected voltage (UcorA, UcorB) by the determined resistance (RdsOn).

2. The estimating method as claimed in claim 1, in which the switching device comprises:
   a first switch connected between the input of the winding and a substantially constant potential (Ubat),
   a second switch (MOS2) connected between the input of the winding and ground, and a transformation module capable of receiving the control voltage (Ucmd) and of separately opening the two switches (MOS1, MOS2) on the basis of the control voltage (Ucmd).

3. The estimating method as claimed in claim 1, in which the correcting step comprises:
   filtering the measured voltage (Umes) by a filter to produce a sinusoidal voltage (Usin), compensating for the sinusoidal voltage (Usin) by a compensator capable of compensating for the attenuating effects of the filter to produce a first corrected voltage (UcorA).

4. The estimating method as claimed in claim 3, in which the filter is a low-pass filter.

5. The estimating method as claimed in claim 3, in which the compensation uses an interpolation table on the basis of a rotation speed ($\omega$) of the motor (M).

6. The estimating method as claimed in claim 1, in which the switching device introduces an idle time producing a voltage variation ($\Delta U$) and in which the correcting step also comprises adding to the first corrected voltage (UcorA) the voltage variation ($\Delta U$) signed with a sign (S) of the estimated current (Iest), in order to produce a second corrected voltage (UcorB).

7. The estimating method as claimed in claim 6, in which the sign (S) of the estimated current (Iest) is determined from a measurement of a measured current (Imes) flowing through the winding.

8. The estimating method as claimed in claim 1, in which the step of determining the resistance (RdsOn) comprises a thermal compensation according to the formula: RdsOn=RdsOnTyp* (1+0.004* (Tmos−20° C.)), where RdsOn is the compensated resistance of the switching device, RdsOnTyp is the typical resistance of the switching device at 20° C. and Tmos is the temperature of the switching device.

9. The estimating method as claimed in claim 6, in which the step of estimating the estimated current (Iest) also comprises a step of canceling the estimated current (Iest) when the difference between the control voltage (Ucmd) and the first corrected voltage (UcorA) is lower, in terms of absolute value, than the voltage variation ($\Delta U$).

10. A method for providing a diagnosis for a sensor capable of measuring a measured current (Imes) flowing through a winding of an electric motor (M) of the type comprising at least one winding controllable by a switching device, the method comprising:
    measuring the measured current (Imes) flowing through the winding by the sensor, determining an estimated current (Iest) flowing through the winding by the estimating method as claimed in claim 1,
    comparing the estimated current (Iest) and the measured current (Imes),
    a negative comparison being indicative of a fault in the sensor (11).

11. The diagnosis method as claimed in claim 10, in which the comparison step comprises:
    calculating a root mean square (Imq) for the difference between the measured current (Imes) and the estimated current (Iest) over a sliding horizon,
    the comparison being positive if the root mean square (Imq) is below a threshold (ImqSeuil), and otherwise negative.

12. A method for controlling an electric motor (M) of the type comprising multiple windings, which are each controllable by a switching device, each winding comprising a sensor capable of measuring a measured current (Imes) flowing through the winding, the control method receiving the measured currents (Imes) at its input and using them to determine the control voltages (Ucmd) for the motor (M), the method comprising:
    providing a diagnosis for each of the sensors by the diagnosis method as claimed in claim 10.

13. The control method as claimed in claim 12, further comprising:
    when a sensor is diagnosed as faulty for a winding, the determining of the controls for the motor (M) continues by replacing, for said winding, the measured current (Imes) with the estimated current (Iest).

14. The control method as claimed in claim 12, further comprising:
    when a sensor is diagnosed as faulty for a winding, the determining of the controls for the motor (M) continues on the windings while excluding the winding whose sensor is faulty.

15. The estimating method as claimed in claim 2, in which the correcting step comprises:
    filtering the measured voltage by a filter to produce a sinusoidal voltage,
    compensating for the sinusoidal voltage by a compensator capable of compensating for the attenuating effects of the filter to produce a first corrected voltage.

16. The estimating method as claimed in claim 3, in which the filter is a low-pass filter of at least 2nd order.

17. The estimating method as claimed in claim 4, in which the compensation uses an interpolation table on the basis of a rotation speed of the motor.

18. The estimating method as claimed in claim 8, in which the step of estimating the estimated current also comprises canceling the estimated current when the difference between the control voltage and the first corrected voltage is lower, in terms of absolute value, than the voltage variation.

* * * * *